United States Patent

Ohashi et al.

[11] Patent Number: 6,132,519
[45] Date of Patent: Oct. 17, 2000

[54] VAPOR DEPOSITION APPARATUS AND VAPOR DEPOSITION METHOD

[75] Inventors: Tadashi Ohashi, Sagamihara; Katuhiro Chaki, Hadano; Ping Xin, Sagamihara; Tatsuo Fujii, Tokuyama; Katsuyuki Iwata, Kudamatu; Shinichi Mitani, Numazu; Takaaki Honda, Mishima, all of Japan

[73] Assignees: Toshiba Ceramics Co., Ltd.; Toshiba Kikai Kabushikikaisha, both of Tokyo, Japan

[21] Appl. No.: 08/991,409

[22] Filed: Dec. 16, 1997

[30] Foreign Application Priority Data

Dec. 19, 1996 [JP] Japan .................................. 8-354382

[51] Int. Cl.⁷ ............................................... C23C 16/00
[52] U.S. Cl. ................................................... 118/730
[58] Field of Search .......................................... 118/730

[56] References Cited

U.S. PATENT DOCUMENTS

| | | | |
|---|---|---|---|
| 2,043,966 | 6/1936 | Whiston et al. | 204/298.28 |
| 4,709,655 | 12/1987 | Van Mastrigt | 118/719 |
| 5,595,606 | 1/1997 | Fujikawa et al. | 118/725 |

FOREIGN PATENT DOCUMENTS 8-291385  11/1996  Japan .

OTHER PUBLICATIONS

Gadgil P. N., "Optimization of a Stagnation Point Flow Reactor Design For Metalorganic Chemical Vapor Deposition By Flow Visualization", vol. 134, No. 3/04, Dec. 1, 1993, pp. 302–312, XP000415696.
Patent Abstracts of Japan, vol. 008, No. 181 (E–261), Aug. 21, 1984 & JP 59 072718 A (Toshiba Corp), Feb. 21, 1995.
Patent Abstracts of Japan, 5–074719, Mar. 1993.
Patent Abstracts of Japan, 5–090167, Apr. 1993.
Patent Abstracts of Japan, 6–216045, Aug. 1994.
Patent Abstracts of Japan, 7–050260, Feb. 1995.

Primary Examiner—Francis J. Lorin
Attorney, Agent, or Firm—Foley & Lardner

[57] ABSTRACT

A vapor deposition apparatus for supplying raw-material gas into a reactor to form a thin film on a wafer substrate disposed in the reactor by vapor deposition, including at least a rotator for mounting the wafer substrate thereon, a treatment gas introducing port, a straightening vane having plural holes, and a wafer substrate feed-in/out port, wherein the lowermost portion of the wafer feed-in/out port is located at a predetermined height from the upper surface of the rotator, and the difference in height between the lowermost portion of the wafer feed-in/out port and the upper surface of the rotator is set to be larger than the thickness of a transition layer of the upper portion of the rotator. In a vapor deposition method, a wafer substrate is mounted on the rotator to form a thin film having little defect and uniform film thickness on the wafer substrate by using the vapor deposition apparatus.

8 Claims, 2 Drawing Sheets

VAPOR DEPOSITION APPARATUS AND VAPOR DEPOSITION METHOD

BACKGROUND OF THE INVENTION

1. Field of the Invention

The present invention relates to a vapor deposition apparatus and a vapor deposition method, and more particularly to a vapor deposition apparatus which is used in a semiconductor manufacturing process or the like and in which occurrence of contaminants is suppressed, and a vapor deposition method for forming a thin film which is uniform in film thickness with little defect.

2. Description of the Related Art

FIG. 3 is a schematic diagram showing a conventional vapor deposition apparatus. In FIG. 3, a rotating substrate holder 32 for mounting a wafer substrate 31 such as silicon wafer or the like, a rotating shaft 33 for rotating the rotating substrate holder 32 and a heater 34 for heating are generally disposed at the lower side in a cylindrical reactor 30, and a motor 35 which is rotationally driven is connected to the rotating shaft 33. Further, plural exhaust ports 36, 36 for exhausting non-reacted gas, etc. are disposed at the bottom portion of the reactor 30, and are connected to an exhaust control device (not shown). Further, plural gas supply pipes 37, 37 and a disc-shaped straightening vane 38 which are adapted to supply raw-material gas and carrier gas into the reactor 30 are provided at the top portion of the reactor 30. Plural holes 38a for regulating the flow of gas are formed in the straightening vane 38. On the side surface of the reactor 30 is provided a wafer substrate feed-in/out port 39 for feeding a wafer substrate (on which a thin film will be vapor-deposited) onto and out from a rotating substrate holder. The wafer substrate feed-in/out port 39 is normally disposed so that the center portion C3 thereof is substantially coincident with the upper surface of the rotating substrate holder 32. For example, the position which is located at a height of about 5 mm to 15 mm from the upper surface of the rotating substrate holder 32 is coincident with the center portion C3 of the wafer substrate feed-in/out port 39.

In the conventional vapor deposition apparatus thus constructed, the substrate 31 mounted on the rotating substrate holder 32 which is rotated at a predetermined rotational number by the rotational driving of the motor 35 is heated to a predetermined temperature by the heater 34 while rotated, and at the same time raw-material gas and carrier gas are supplied into the reactor 30 through the plural gas supply pipes 37, 37 to make uniform the gas momentum and the pressure distribution. Further, these gas are passed through the holes 38a of the straightening vane 38 and then supplied onto the surface of the wafer substrate 31 on the rotating substrate holder 32 at an uniform flow velocity, thereby forming a thin film on the wafer substrate 31 by vapor deposition.

In the vapor deposition apparatus for forming a thin film on a semiconductor wafer, various proposals have been made to prevent occurrence of a lot of particles due to thin-film forming gas and adhesion of deposits to the inner wall of the reactor, and to prevent occurrence of crystal defects due to inconvenience in the thin-film forming process, thereby obtaining a wafer having a thin film which is uniform in quality and thickness. For example, in Japanese Laid-open Patent Application No. Hei-5-74719, the supply amount of raw-material gas is controlled to a predetermined value to prevent the temperature variation in the reactor, thereby preventing occurrence of crystal defects. Further, in Japanese Laid-open Patent Application No. Hei-5-90167, the raw-material gas amount, the pressure in the reactor, the rotational number of the rotating substrate holder, etc. are controlled to predetermined values to prevent slip. In Japanese Laid-open Patent Application No. Hei-6-216045, a part of the inner wall of the reactor on which deposits are liable to be produced is provided with a shielding pipe while the inner peripheral surface thereof is kept smoothened to facilitate a cleaning work of the reactor after the thin-film forming process is finished, and also the gas flow is kept to a laminar flow to form a uniform thin film. Further, in Japanese Laid-open Patent Application No. Hei-7-50260, a method for introducing raw-material gas and carrier gas into the reactor is set to a predetermined one to make the gas momentum and the gas pressure uniform, whereby the raw-material, etc. are supplied at an uniform flow velocity to make the thickness of the thin film uniform.

However, even in the various conventional proposed vapor deposition apparatuses, crystal defects occur in a wafer substrate on which a thin film is grown, and the inconvenience such as adhesion of particles or the like cannot be sufficiently prevented. Further, since higher quality is increasingly required to wafer substrates due to recent ultrahigh integration design of semiconductors, so that degradation of quality due to a slight defect on a thin-film formed wafer substrate frequently induces troubles.

SUMMARY OF THE INVENTION

In view of the degradation of quality of the wafer substrate in the vapor deposition thin-film forming process according to the conventional phase deposition apparatuses, the present invention has been implemented to solve the above problem. The inventors of this application has make detailed considerations on phenomena occurring in the conventional vapor deposition apparatuses. As a result, they have observed such a phenomenon that particles adhered to the wall of the reactor in the vicinity of the wafer substrate feed-in/out port 39, and therefore they have found out that the particles adhering to the wall of the reactor adhere to a substrate in a wafer substrate feeding process to induce crystal defects, or the particles directly cause the degradation of quality as adhesive particles.

On the basis of the above knowledge, the inventors has considered the flow of raw-material gas, etc. in order to find out the cause of the adhesion phenomenon of a lot of particles. As a result, The thin-film forming raw-material gas of silicon or the like, etc. which are introduced from the top portion of the reactor and supplied onto the wafer substrate 31 at an uniform flow velocity as described above arrives in the vicinity of the wafer substrate 31 at the lower side of the reactor 30. In this case, the lower portion of the reactor 30 is heated by the heater 34 and kept at a temperature higher than that at the upper portion. Therefore, it was found out that there occurred such a blow-up phenomenon that the gas such as the raw-material gas, etc. ascends along the wall of the reactor again after the flow of the gas such as the raw-material gas, etc. arrives in the vicinity of the wafer substrate 31 as indicated by an arrow of FIG. 3. At the same time, since the wafer feed-in/out port 39 is located at the substantially same height as the upper surface of the rotating substrate holder 32 as described above, it is coincident with the an occurrence area of the blow-up phenomenon. In addition, the blow-up gas flows into a duct intercommunicating with the wafer feed-in/out port 39 and then ascends along the wall of the reactor. Particularly, it has been found out that a lot of particles occurring in vapor phase adhered to the wall of the reactor in the proximity of the wafer feed-in/out port 39. Further, it has been also found out that the temperature of the environmental gas in the reactor 30 increases because the heated raw-material gas, etc. ascend, so that uniform nucleus formation of the thin-film forming raw-material gas in the vapor phase is increased and thus the occurrence of the particles in the vapor phase is also increased.

On the basis of the above knowledge, the inventors has found out that a cause of the problem such as the degradation of quality of the thin-film formed wafer substrate, etc. is the position at which the wafer substrate feed-in/out port is located on the wall of the reactor, and also has found out that unlike the conventional apparatus, the wafer substrate feed-in/out port is located at a position higher or lower than the rotating substrate holder by a predetermined height to prevent adhesion of a lot of particles to the reactor wall of the conventional vapor deposition apparatus, particularly in the vicinity of the wafer substrate feed-in/out port, and thus the quality degradation of the wafer substrate can be prevented. On the basis of these knowledge, the inventors has implemented the present invention. That is, the present invention has an object to provide a vapor deposition apparatus in which particles occurring due to uniform nucleus formation of silicon raw-material gas can be prevented from adhering to the vicinity of the wafer substrate feed-in/out port, and also the occurring particles are not fed to the vicinity of the wafer substrate feed-in/out port, thereby performing a vapor deposition process to form on a wafer substrate a uniform thin film which has little defect and high quality.

In order to attain the above object, according to the present invention, a vapor deposition apparatus for supplying raw-material gas into a reactor to form a thin film on a wafer substrate disposed in the reactor by vapor deposition, includes at least a rotator which is disposed in the apparatus and adapted to mount the wafer substrate thereon, a treatment gas introducing port which is disposed at the top portion of the apparatus, a straightening vane having plural holes which is disposed at the upper portion in the apparatus, and a wafer substrate feed-in/out port at the side portion of the apparatus, wherein the lowermost portion of the wafer feed-in/out port is located at a position higher than the upper surface of the rotator, and the difference in height (I(mm)) between the lowermost of the wafer feed-in/out port and the upper surface of the rotator is set to be larger than the thickness of a transition layer (T) of the upper portion of the rotator (I>T).

In the vapor deposition apparatus thus constructed, the thickness of the transition layer (T) is calculated from $3.22(v/\omega)^{1/2}$ (v represents coefficient of kinematic viscosity ($mm^2$/s) of atmospheric gas in the reactor and $\omega$ represents the angular velocity of the rotation), and the difference in height can be set to be larger than the calculation value. In this case, $\omega$ is assumed to be set to the minimum value during the thin-film forming process in the vapor deposition apparatus. Further, it is preferable that the reactor has upper and lower portions which are different in inner diameter, the inner diameter of the upper portion is smaller than the inner diameter of the lower portion, the rotator is disposed inside the lower portion of the reactor, and the wafer substrate feed-in/out port is disposed at the side portion of the upper portion, and also it is preferable that the different in height (II) between the upper surface of the rotator and the lower end of the side portion of the upper portion is set to be larger than the thickness of the transition layer (T).

Further, according to the present invention, there is provided a vapor deposition method for mounting a wafer substrate on the rotator to form a thin film having little defect and an uniform thickness on the wafer substrate by using the vapor deposition apparatus as described above.

Still further, according to the present invention, there is provided a vapor deposition method for supplying raw-material gas into a reactor to form a thin film on a wafer substrate mounted on a rotator in the reactor by vapor deposition, is characterized in that the rotational number, materials of gas, the temperature, and the inner pressure are controlled so that the thickness of the transition layer of gas flow on the rotator $(T)=3.22(v/\omega)^{1/2}$ is smaller than the difference in height (H) between the upper surface of the rotator and the center portion of the wafer substrate feed-in/out port disposed at the side portion of the reactor.

According to the present invention thus constructed, the wafer substrate feed-in/out port on the side wall of the reactor is disposed at a position higher than the transition layer thickness, that is, it is disposed in an area where the flow of the raw-material gas supplied through the straightening vane is directed vertically to the rotator, so that no blow-up phenomenon of gas occurs in the vicinity of the wafer substrate feed-in/out port to thereby prevent adhesion of particles which occur in vapor phase due to uniform nucleus formation of silicon raw-material gas, and also the particles in vapor phase are not transported to the vicinity of the wafer substrate feed-in/out port. Accordingly, the particles never adhere to the wafer substrate during the feed-in/out operation of the wafer substrate, and it can be prevented to increase the crystal defects and the adhering particles on the wafer substrate on which the thin film is formed by the vapor deposition, so that a high-quality thin-film formed wafer substrate can be manufactured.

In the present invention, the transition layer is defined as a gas layer comprising the raw-material gas which is supplied through the straightening vane and then flows with a vector directing from the center to the outer peripheral portion on the rotator, and the transition layer thickness is defined as the thickness of the gas flow having the vector on the rotator.

DETAILED DESCRIPTION OF THE PREFERRED EMBODIMENTS

Preferred embodiments according to the present invention will be described with reference to the accompanying drawings, however, the present invention is not limited to the following embodiment.

Figure 1:
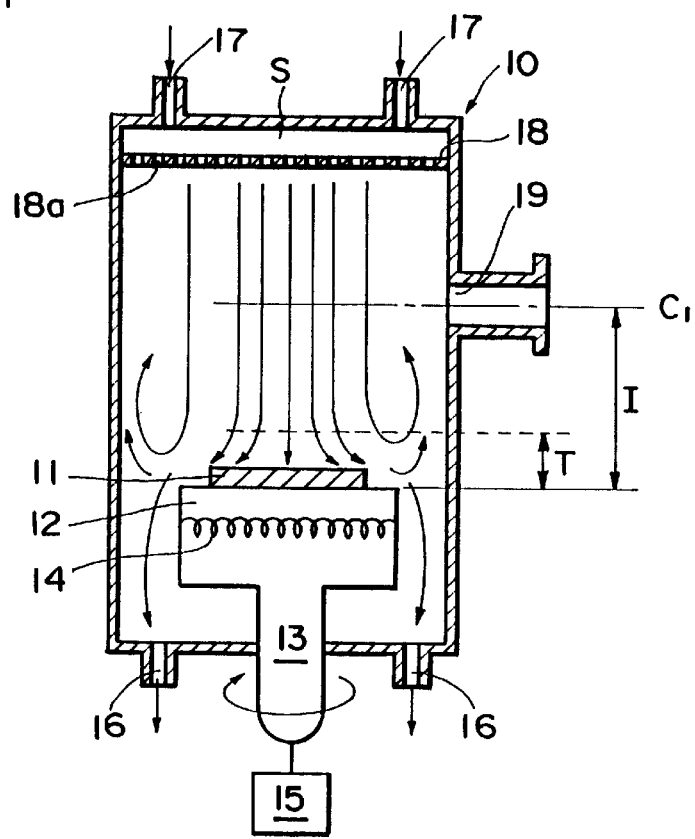
FIG. 1 is a cross-sectional view showing an embodiment of a vapor deposition apparatus of the present invention.

FIG. 1 is a cross-sectional view showing an embodiment of a vapor phase deposition apparatus of the present invention. In FIG. 1, a reactor 10 is designed in the substantially same construction as the reactor of the above-described conventional vapor deposition apparatus. A rotator 12 on which a wafer substrate 11 is mounted is supported freely rotatable by a rotating shaft 13, and a heater 14 for heating the rotator 12 and the wafer substrate 11 mounted on the rotator 12 is disposed at the lower portion of the rotator 12.

The rotating shaft 13 is connected to a rotating motor 15. Further, plural exhaust ports 16 for exhausting non-reacted gas, etc. are provided at the bottom portion of the reactor 10. Further, at the top portion of the reactor 10 is provided plural gas supply pipes 17 for supplying raw-material gas such as silane ($SiH_4$), dichlorosilane ($SiH_2Cl_2$) or the like and carrier gas such as hydrogen ($H_2$), argon (Ar) or the like. A disc-shaped straightening vane 18 having plural holes 18a are disposed in contact with the inner peripheral surface of the reactor 10 at the upper portion in the reactor 10 with keeping a predetermined space area S from the top portion of the reactor 10 so that no drift current passage is not formed by the supply gas. Further, a wafer substrate feed-in/out port 19 is disposed at the upper portion on the side surface of the reactor 10, which is different from the reactor of the conventional vapor deposition apparatus in which the wafer substrate feed-in/out port 19 is located at the substantially same height as the upper surface portion of the rotator.

The vapor deposition apparatus of the present invention is constructed as described above, and the inside of the reactor 10 is exhausted by the exhausting control device which is connected to the exhausting ports 16, thereby adjusting the pressure in the reactor, for example, adjusting the inner pressure of $H_2$ gas containing the raw-material gas of silane gas to 20 to 50 torr. Further, the rotator 12 is rotated by actuating the motor 15 to rotate the rotating shaft 13, and the wafer substrate 11 on the rotator 12 is also rotated with the rotator 12. At the same time, the wafer substrate 11 on the rotator 12 is heated to about 900 to 1200° C., for example. Further, at the same time, the raw-material gas and the carrier gas are supplied from the gas supply pipes 17 into the reactor 10 while controlling the flow rate thereof to a predetermined value. The gas flow which is supplied from the plural supply pipes 16 into the space area S is made uniform in momentum and pressure distribution, and then passed through the holes 18a of the straightening vane to be supplied onto the substrate at an uniform flow velocity, thereby forming a thin film on the substrate by vapor deposition. As in the case of the conventional vapor deposition apparatus, in the vapor deposition apparatus of the present invention, the wafer substrate feed-in/out port 19 is disposed on the side wall of the reactor, and a part of the side wall is opened. However, the present invention and the prior art is greatly different in that the wafer substrate feed-in/out port 19 is located at a position higher than the rotator 12 so that there is a difference in height (I) between the center portion C1 of the wafer substrate feed-in/out port 19 and the upper surface of the rotator 12. Due to the difference in height (I) between the disposing position of the wafer substrate feed-in/out port and the rotator 12, the flow of the supply gas such as the raw-material gas, etc. in the reactor produces the blow-up phenomenon in the vicinity of the rotator 12 and the wafer substrate 11 at the lower portion of the reactor, but it does not reach the wafer substrate feed-in/out port 19 as shown in FIG. 1. Therefore, the particles of the thin-film forming raw material which occur in the vapor phase never adhere to the inner wall of the reactor in the vicinity of the wafer substrate feed-in/out port.

In the vapor phase apparatus of the present invention, the height difference (I) between the wafer substrate feed-in/out port 19 disposed on the side wall of the reactor and the upper surface of the rotator 12 is normally set to be larger than the thickness (T) of the transition layer of the gas flow supplied onto the upper portion of the rotator, that is, the gas layer comprising gas flow of the raw-material gas, etc. which is supplied through the straightening vane and has a vector directing from the center to the outer peripheral portion on the rotator. If the height difference (I) is smaller than the transition layer thickness T, the gas flow in the reactor has a flow component directing from the center of the reactor to the side wall of the reactor, so that the gas flows to the substrate feed-in/out port disposed on the side wall of the reactor, and the particles which are produced in vapor phase due to the uniform nucleus formation of the thin-film forming gas may adhere to the inner wall of the reactor in the vicinity of the substrate feed-in/out port. The transition layer thickness T of the gas flow at the upper portion of the rotator is varied mainly on the basis of the type of the atmospheric gas in the reactor, the pressure in the reactor and the rotational number of the rotator. However, it can be calculated from the following equation (1). The following equation (1) is generally provided in hydrodynamics:

$$T = 3.22(v/\omega)^{1/2} \quad (1)$$

($v$ represents the coefficient of kinematic viscosity of atmospheric gas in the reactor ($mm^2/s$), and $\omega$ represents the angular velocity (rad/s) of the rotation). In this case, $\omega$ is assumed to be set to the minimum value during the thin-film forming process in the vapor deposition apparatus).

For example, when the raw-material gas is silane gas, the carrier gas is hydrogen gas and the rotational number of the rotator is set to 500 to 2000 rpm (52 to 209 rad/s), the transition layer thickness T is equal to about 5 to 50 mm. Accordingly, the wafer substrate feed-in/out port of the reactor of the vapor deposition apparatus is disposed on the side wall of the upper portion of the reactor so that it is located at a position which is higher than the upper surface of the rotator by the value of T or more, whereby the particles of the thin-film forming raw material are prevented from adhering to the inner wall of the reactor in the vicinity of the wafer substrate feed-in/out port and no defect occur in crystal phase of the thin-film formed wafer to thereby form an uniform thin film.

Figure 2:
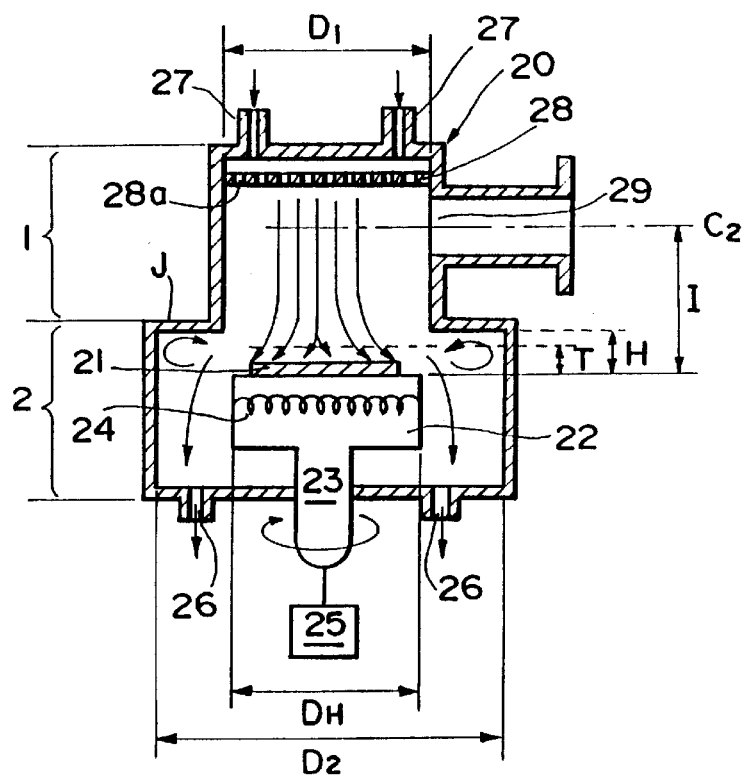
FIG. 2 is a cross-sectional view showing another embodiment of the vapor deposition apparatus of the present invention.

FIG. 2 is a cross-sectional view showing another embodiment of the vapor deposition apparatus of the present invention. In FIG. 2, the vapor deposition apparatus of this embodiment is the same as that of FIG. 1 except that the upper portion 1 of a reactor 20 is designed to be narrower than the lower portion 2 thereof, that is, the inner diameter D1 of the upper portion is set to be smaller than the inner diameter D2 of the lower portion (D1<D2), and the wafer substrate feed-in/out port 29 is disposed on the side wall of the upper portion 1 of the reactor 20. The same members in FIGS. 1 and 2 are represented by setting a numeral of one figure for each reference numeral to the same value, and the rotator 22 has a diameter $D_S$. In this case, the height difference H between the upper surface of the rotator 22 and the lower end portion of the upper portion having a smaller inner diameter is set to be larger than the transition layer thickness I of the supplied gas flow, whereby the gas flow along the side wall is prevented from reaching the center portion C2 of the wafer substrate feed-in/out port 29 due to the blow-up of the gas flow. Therefore, as in the case of the vapor deposition apparatus of FIG. 1, no particle of thin-film forming raw material adheres to the inner wall in the vicinity of the wafer substrate feed-in/out port, so that a thin-film formed wafer which has no defect in crystal defect and has an uniform thin film can be obtained.

In the reactor in which the upper and lower portions have different diameters as shown in FIG. 2, it is preferable that the side wall surface of the upper portion is formed vertically to the upper surface of the rotator in order to keep the gas flow velocity uniform at the upper portion of the rotator. Further, it is preferable that the link portion J between the upper portion 1 and the lower portion 2 is in parallel to the upper surface of the rotator 22 in order to keep the gas flow uniform in the vicinity of the rotator. Still further, it is preferable that the link angle of the link portion J has a curvature like a curved surface in order to prevent turbulent flow. In addition, it is preferable that $D_I/D_S$ is equal to 0.7 to 1.2, $D_2/D_1$ is equal to 1.2 or more and $D_2/D_S$ is equal to 1.2 or more because the particles adhering to the inner wall of the upper portion fall down onto the wafer, an eddy occurs in the gas flow and turbulence of gas flow occurs at the outer peripheral side of the rotator, resulting in deposition of deposits on the inner wall of the lower portion 2 of the reactor. Further, it is preferable that H is larger than the transition layer thickness T of the upper portion of the rotator 22 because the blow-up phenomenon of the gas flow is remarkable to induce eddies, so that a lot of deposits adhere to the link portion J and the inner wall of the lower portion 2 of the reactor. By satisfying the above conditions at each member of the reactor, a thin-film formed wafer having little defect and an uniform film thickness can be obtained. In this case, the following inequality $H > 3.22(v/\omega)^{1/2}$ can be set on the equation (1) the $T = 3.22(v/\omega)^{1/2}$ (v represents the coefficient of kinematic viscosity of atmospheric gas in the reactor (mm$^2$/s), and $\omega$ represents the angular velocity (rad/s) of the rotation).

As described above, the vapor deposition apparatus of the present invention may be designed and manufactured in the same manner as the conventional apparatus, for example, in the size and material of the apparatus, the material of the straightening vane, the formation and disposing position of the holes of the straightening vane, the mount position of the rotator and the heater, etc., except that the height difference between the wafer substrate feed-in/out port disposed on the side wall of the reactor and the rotator is set to a predetermined value. Further, the vapor deposition method using the vapor deposition apparatus of the present invention may be performed in the same manner as the conventional method.

EMBODIMENTS

Embodiments 1 and 2

Each of the embodiments 1 and 2 used a vapor deposition apparatus containing a reactor which had the same construction as the reactor shown in FIG. 1 and in which a wafer substrate feed-in/out port 19 was disposed so as to have a height difference I between the center portion C1 thereof and the rotator 12 as shown in table 1. SiH$_4$ gas was used as raw-material gas and H$_2$ gas was used as carrier gas. Further, gas obtained by containing 0.1 ppm of diborane (B$_2$H$_6$) in H$_2$ gas was used as dopant. These kinds of gas were supplied at the flow rate shown in the table 1, and a B$_2$H$_6$ dopant silicon thin film was formed on a silicon wafer by vapor deposition under the vapor deposition conditions shown in the table 1. After the vapor deposited thin film was formed, adhesion of particles in the vicinity of the wafer substrate feed-in/out port 19 of the vapor deposition apparatus being used was visually observed. The presence or absence of the adhesion (visual observation result) is shown in the table 1. Further, the number of LPDs (wafer surface laser scatters (containing particles)) of 0.135 micrometer or more was measured for the thin-film formed wafer by Surfscan 6200 produced by Tencol company, and the result is shown as the number per wafer in the table 1.

Embodiments 3 and 4

A B$_2$H$_6$ dopant silicon thin film was formed on the surface of a silicon wafer in the same manner as the embodiment 1 except for use of a vapor deposition apparatus having a reactor which was designed in the same construction as the reactor shown in FIG. 2 so as to have the ratio of the inner diameter D1 of the upper portion and the inner diameter D2 of the lower portion 2 shown in the table 1. The diameter $D_S$ of the rotator of the reactor and the ratio of D1 and D2, the height difference H between the upper surface of the rotator 22 and the lower end portion of the upper portion 1, and the height difference I between the rotator 22 and the center portion C2 of the wafer substrate feed-in/out port 29 are shown in the table 1. Further, in the table 1 are also shown the presence or absence of the adhesion of particles in the vicinity of the wafer substrate feed-in/out port 29 which was observed in the same manner as the embodiment 1, and the number of LPDs of 0.135 micrometer or more in the crystal phase of the thin-film formed wafer thus formed.

Comparison examples 1 and 2

Figure 3:
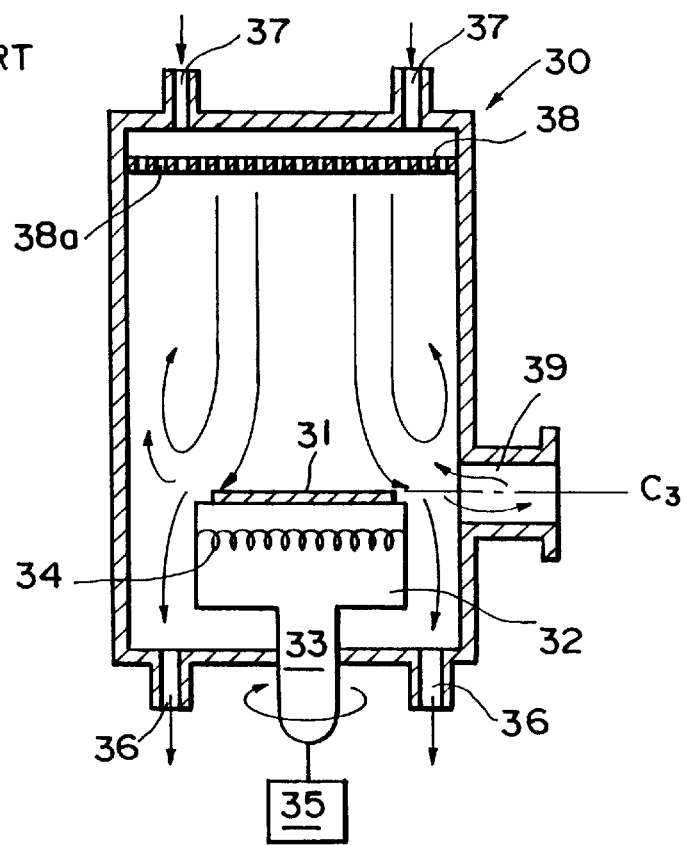
FIG. 3 is a cross-sectional view showing a conventional vapor deposition apparatus which is used to be compared with the present invention.

A B$_2$H$_6$ dopant silicon thin film was formed on the surface of a silicon wafer in the same manner as the embodiment 1 except for use of a vapor deposition apparatus having a reactor which was designed in the same construction as the reactor shown in FIG. 3 and in which the wafer substrate feed-in/out port 39 was disposed so as to have the height difference I between the center portion C3 and the rotator 32 shown in the table 2.

In the table 2 are shown the presence or absence of the adhesion of particles in the vicinity of the wafer substrate feed-in/out port 39 which was observed in the same manner as the embodiment 1, and the number of LPDs of 0.135 micrometer or more in the crystal phase of the thin-film formed wafer thus formed.

Comparison example 3

Figure 4:
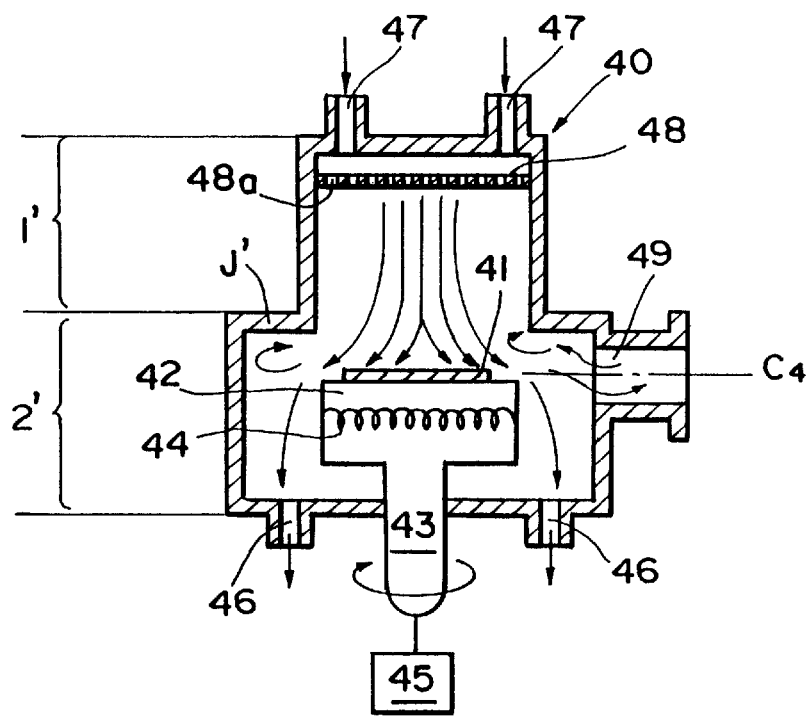
FIG. 4 is a cross-sectional view showing another vapor deposition apparatus which is used to be compared with the present invention.

As in the case of the reactor 20 shown in FIG. 2, a B$_2$H$_6$ dopant silicon thin film was formed on the surface of a silicon wafer in the same manner as the embodiment 3 except for use of a vapor deposition apparatus including a reactor having an upper portion 1' and a lower portion 2' which were different in diameter as shown in FIG. 4 and in which the wafer substrate feed-in/out port 49 was disposed so that the center portion C4 thereof and the rotator 42 were disposed so as to have the height difference between the center portion C3 and the rotator 32 shown in the table 2. In the table 2 are also shown the presence or absence of the adhesion of particles in the vicinity of the wafer substrate feed-in/out port 49 which was observed in the same manner as the embodiment 1, and the number of LPDs of 0.135 micrometer or more in the crystal phase of the thin-film formed wafer thus formed.

[Table 1]
[Table 2]

As is apparent from the above embodiments and the comparison examples, in the comparison examples using the same apparatus as the prior art, the particles adhered to the inner wall in the vicinity of the wafer substrate feed-in/out port. On the other hand, in the embodiments using the reactor in which a relatively large height difference I was set between the center portion of the wafer substrate feed-in/out port and the upper surface of the rotator on which the thin-film formed wafer substrate was mounted, no particle adhered to the inner wall in the vicinity of the wafer substrate. Further, the LPD number of the crystal phase on the surface of the thin-film formed wafer thus obtained could be reduced to about 1/50 or less of the comparison examples.

In the case where the reactor being used had upper and lower portions which were different in inner diameter, the LPD number could be more remarkably reduced even in the comparison example like the prior art (comparison example 3) as compared with the LPD number of the embodiments 1 and 2 which had the reactors having the upper and lower portions which were equal in inner diameter, and the LPD number could be reduced to about two-thirds, thereby obtaining a remarkably high quality wafer. In addition, even when this type of reactor (having upper and lower portions which are different in inner diameter) was used, there was a difference in particle adhesion between the comparison example 3 and the embodiments 3 and 4 (each of which had a reactor having upper and lower portions which were different in inner diameter). That is, in the comparison example 3, adhesion of particles were observed on the inner wall in the vicinity of the wafer substrate feed-in/out port in the comparison example 3. On the other hand, in the embodiments 3 and 4, no adhesion of particles were observed. This difference in particle adhesion (that is, adhesion and non-adhesion) is a critical difference to industrial applications. For example, when a vapor deposition apparatus in which particle adhesion occurs once is repetitively used, it is easily estimated that the number of LPD increases more and more as the frequency of use of the apparatus increases, and thus a cleaning work is needed.

The transition layer thickness T in the above embodiments and comparison examples was set to 18 to 21 mm which was calculated from the equation (1) by setting ω=209 rad/s and v=6608 to 8811 mm²/s. In the above embodiments, it is apparent that the height difference I were set to be greatly larger than the T value. Further, the LPD number in the comparison example was more greatly reduced as compared with the comparison example 1 because the inner pressure in the reactor was reduced to increase the flow rate of the carrier gas so that the blow-up phenomenon of the gas flow in the vicinity of the rotator at the lower portion of the reactor was suppressed. However, in the comparison example 2 particle adhesion occurred on the inner wall of the wafer substrate feed-in/out port and thus it had still the disadvantage.

As described above, in the vapor deposition apparatus of the present invention, the wafer substrate feed-in/out port at the side portion of the reactor is disposed at a predetermined height from the upper surface of the rotator disposed in the reactor. Therefore, the position at which the wafer substrate feed-in/out port is located is not coincident with the blow-up area in which the thin-film forming raw-material gas ascends again in the vicinity of the rotator, so that particles which are produced in vapor phase due to uniform nucleus formation of raw-material gas are prevented from adhering to the inner wall in the vicinity of the wafer substrate feed-in/out port. Therefore, no particle adheres to the wafer substrate in the substrate feeding process to prevent increase of crystal defects and adhering particles, whereby a thin-film formed wafer which is high quality and uniform in film thickness can be obtained. Further, in the reactor in which the inner diameter of the upper portion is smaller than the inner diameter of the lower portion (i.e., the upper and lower portions are different in inner diameter), the crystal defects can be further reduced, and a wafer which is optimum to high integration can be obtained.

TABLE 1

|  | Emb.1 | Emb.2 | Emb.3 | Emb.4 |
|---|---|---|---|---|
| VAPOR DEPOSITION CONDITION |  |  |  |  |
| TEMPERATURE (° C.) | 1000 | 1000 | 1000 | 1000 |
| PRESSURE (torr) | 40 | 40 | 40 | 40 |
| SiH$_4$ GAS FLOW RATE (1/min) | 0.3 | 0.3 | 0.3 | 0.3 |
| CARRIER GAS (H$_2$) FLOW RATE (1/min) | 30 | 30 | 30 | 30 |
| B$_2$H$_6$ CONTAINED H$_2$ GAS FLOW RATE (1/min) | 0.01 | 0.01 | 0.01 | 0.01 |
| ROTATIONAL NUMBER OF ROTATOR (rpm) | 2000 | 2000 | 2000 | 2000 |
| APPARATUS CONDITION |  |  |  |  |
| I (mm) | 100 | 200 | 100 | 200 |
| D$_1$/D$_s$ RATIO | — | — | 1.0 | 1.0 |
| D$_2$/D$_1$ RATIO | — | — | 1.25 | 1.25 |
| D$_2$/D$_s$ RATIO | — | — | 1.25 | 1.25 |
| H (mm) | — | — | 50 | 50 |
| RESULT |  |  |  |  |
| LPD (>0.135 μm) | 621 | 513 | 83 | 79 |
| PARTICLE ADHESION TO INNER WALL AROUND FEED-IN/OUT PORT | no | no | no | no |

TABLE 2

|  | Comp. Examp. | | |
|---|---|---|---|
|  | 1 | 2 | 3 |
| VAPOR DEPOSITION CONDITION |  |  |  |
| TEMPERATURE (° C.) | 1000 | 1000 | 1000 |
| PRESSURE (torr.) | 40 | 30 | 40 |
| SiH$_4$ GAS FLOW RATE (1/min) | 0.3 | 2.0 | 0.3 |
| CARRIER GAS (H$_2$) FLOW RATE (1/min) | 30 | 200 | 30 |
| B$_2$H$_6$ CONTAINED H$_2$ GAS FLOW RATE (1/min) | 0.01 | 0.07 | 0.01 |
| ROTATIONAL NUMBER OF ROTATOR (rpm) | 2000 | 2000 | 2000 |
| APPARATUS CONDITION |  |  |  |
| I (mm) | 10 | 10 | 5 |
| D$_1$/D$_s$ RATIO | — | — | 1.0 |
| D$_2$/D$_1$ RATIO | — | — | 1.25 |
| D$_2$/D$_s$ RATIO | — | — | 1.25 |
| H (mm) | — | — | 50 |
| RESULT |  |  |  |
| LPD (>0.135 μm) | 33707 | 1087 | 125 |
| PARTICLE ADHESION TO INNER WALL AROUND FEED-IN/OUT PORT | adhesion | adhesion | adhesion |

What is claimed is:

1. A vapor deposition apparatus for supplying raw-material gas into a reactor to form a thin film on a wafer substrate disposed in the reactor by vapor deposition, characterized by including: at least a rotator which is disposed in said apparatus and adapted to mount the wafer substrate thereon, a treatment gas introducing port which is disposed at the top portion of said apparatus, a straightening vane having plural holes which is disposed at the upper portion in said apparatus, and a wafer substrate feed-in/out port at the side portion of said apparatus, wherein the lowermost portion of said wafer feed-in/out port is located at a position higher than the upper surface of said rotator, and the difference in height (I(mm)) between the lowermost portion of said wafer feed-in/out port and the upper surface of said rotator is set to be larger than the thickness of a transition layer (T) of the upper portion of said rotator (I>T).

2. The vapor deposition apparatus as claimed in claim 1, wherein the thickness of said transition layer (T) is calculated from $T=3.22(v/\omega)^{1/2}$ (v represents the coefficient of kinematic viscosity ($mm^2/s$) of atmospheric gas in said reactor and $\omega$ represents the angular velocity of the rotation), and the difference in height is set to be larger than the calculation value.

3. The vapor deposition apparatus as claimed in claim 1, wherein said reactor has upper and lower portions which are different in inner diameter, the inner diameter of said upper portion being smaller than the inner diameter of said lower portion, said rotator is disposed inside the lower portion of said reactor, and said wafer substrate feed-in/out port is disposed at the side portion of the upper portion, and wherein the different in height (II) between the upper surface of said rotator and the lower end of the side portion of said upper portion is set to be larger than the thickness of the transition layer (T).

4. The vapor deposition apparatus as claimed in claim 2, wherein said reactor has upper and lower portions which are different in inner diameter, the inner diameter of said upper portion being smaller than the inner diameter of said lower portion, said rotator is disposed inside the lower portion of said reactor, and said wafer substrate feed-in/out port is disposed at the side portion of the upper portion, and wherein the different in height (II) between the upper surface of said rotator and the lower end of the side portion of said upper portion is set to be larger than the thickness of the transition layer (T).

5. A vapor deposition method using said vapor deposition apparatus as claimed in claim 1, characterized by comprising the steps of mounting a wafer substrate on said rotator, and then forming a thin film having little defect and uniform film thickness on said wafer substrate by using vapor deposition apparatus.

6. A vapor deposition method for supplying raw-material gas into a reactor to form a thin film on a wafer substrate mounted on a rotator in the reactor by vapor deposition, characterized in that the rotational number of said rotator, the materials of the raw-material gas, the temperature in said reactor, and the inner pressure in said reactor are controlled so that the thickness of the transition layer of gas flow on said rotator $(T)=3.22(v/\omega)^{1/2}$ is smaller than the difference in height (H) between the upper surface of said rotator and the center portion of said wafer substrate feed-in/out port disposed at the side portion of said reactor.

7. A vapor deposition method using said vapor deposition apparatus as claimed in claim 2, characterized by comprising the steps of mounting a wafer substrate on said rotator, and then forming a thin film having little defect and uniform film thickness on said wafer substrate by using vapor deposition apparatus.

8. A vapor deposition method using said vapor deposition apparatus as claimed in claim 3, characterized by comprising the steps of mounting a wafer substrate on said rotator, and then forming a thin film having little defect and uniform film thickness on said wafer substrate by using said vapor deposition apparatus.

* * * * *